US009810731B2

United States Patent
Higuchi et al.

(10) Patent No.: US 9,810,731 B2
(45) Date of Patent: Nov. 7, 2017

(54) LOAD DRIVE APPARATUS

(71) Applicant: NGK SPARK PLUG CO., LTD., Nagoya-shi, Aichi (JP)

(72) Inventors: Yuzo Higuchi, Komaki (JP); Tomonori Uemura, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/956,558

(22) Filed: Dec. 2, 2015

(65) Prior Publication Data

US 2016/0161542 A1  Jun. 9, 2016

(30) Foreign Application Priority Data

Dec. 3, 2014  (JP) ................. 2014-244986

(51) Int. Cl.
*G01R 31/02* (2006.01)
*H05B 3/02* (2006.01)
*H05B 1/02* (2006.01)

(52) U.S. Cl.
CPC ......... *G01R 31/025* (2013.01); *H05B 1/0227* (2013.01); *H05B 3/02* (2013.01)

(58) Field of Classification Search
USPC .......... 324/509, 543, 432, 433, 500, 750.01; 73/23.32; 323/271; 307/43; 340/514, 340/572.1; 370/216; 702/116
See application file for complete search history.

(56) References Cited

U.S. PATENT DOCUMENTS

| 5,327,780 | A | | 7/1994 | Entenmann et al. |
| 5,854,555 | A | * | 12/1998 | Sasaki ................. G01R 31/007 324/503 |
| 7,481,094 | B2 | * | 1/2009 | Inagaki ............... F02D 41/1443 701/109 |
| 8,052,863 | B2 | * | 11/2011 | Suzuki ............... G01N 27/4175 204/406 |
| 2004/0222094 | A1 | * | 11/2004 | Ieda .................... G01N 27/4175 204/424 |
| 2012/0161822 | A1 | * | 6/2012 | Kanayama ........... G01R 31/026 327/109 |

FOREIGN PATENT DOCUMENTS

| JP | 05-195843 A | 8/1993 |
| JP | 3339107 B2 | 8/2002 |

* cited by examiner

*Primary Examiner* — Melissa Koval
*Assistant Examiner* — Nasima Monsur
(74) *Attorney, Agent, or Firm* — Stites & Harbison, PLLC; Jeffrey A. Haeberlin

(57) ABSTRACT

When a voltage applied to a heater assumes a low-level potential, a control section of a load drive apparatus instantaneously supplies an anomaly judgment current to the heater, and computes the electrical resistance of the heater on the basis of the anomaly judgment current. The control section judges whether or not any of anomalous states of the heater, including at least a deteriorated state of the heater and wiring anomalous states of the heater, has occurred on the basis of the electrical resistance of the heater.

3 Claims, 4 Drawing Sheets

LOAD DRIVE APPARATUS

CROSS REFERENCE TO RELATED APPLICATIONS

The present application claims priority to Japanese Patent Application No. 2014-244986, which was filed on Dec. 3, 2014, the disclosure of which is herein incorporated by reference in its entirety.

BACKGROUND OF THE INVENTION

Field of the Invention

The present invention relates to a load drive apparatus which includes an application voltage control section for applying to an electrical load a pulse voltage alternately assuming a high potential and a low potential and which drives and controls the electrical load.

Description of Related Art

An example of a load drive apparatus which drives and controls an electrical load such as a heater for heating a gas detection element is one having an application voltage control section for applying to the electrical load a pulse voltage alternately assuming a high potential and a low potential.

In such a load drive apparatus, there may occur various anomalous states such as a short-to-ground anomalous state in which opposite ends of an electrical load are connected to the ground potential (GND potential) and a wire breakage anomalous state in which an energization path for applying a pulse voltage to the electrical load is broken.

In view of this, there has been proposed an apparatus which has a function of judging whether or not there has occurred the short-to-ground anomalous state of the electrical load or the wire breakage anomalous state of the energization path (Patent Document 1). Namely, Patent Document 1 discloses an apparatus which measures the power supply voltage of a heater when the heater is operated and when the heater is not operated and which outputs a corresponding failure signal when the difference between the measured values of the power supply voltage is less than a predetermined minimum value or greater than a predetermined maximum value.

Meanwhile, as a result of long-term use, the electrical characteristics of the electrical load may change, and the electrical load may come into a deteriorated state. However, the apparatus disclosed in Patent Document 1 cannot detect such a deteriorated state of the electrical load.

In order to overcome such a drawback, there has been proposed an anomaly detection apparatus which judges a deteriorated state of an electrical load through use of a current detection resistor (shunt resistor) which is connected in series to the electrical load and in parallel to a switching element of the application voltage control section (Patent Document 2). Notably, the switching element is provided as a portion of the application voltage control section. The application voltage control section is provided so as to switch the conduction state of an energization path extending from a power supply to the electrical load by turning the switching element on and off, to thereby control the voltage applied to the electrical load.

Namely, in this anomaly detection apparatus, when the supply of electricity to the electrical load by the application voltage control section is stopped, a deteriorated state of the electrical load is judged on the basis of the current of the electrical load detected through use of the current detection resistor.

RELATED ART DOCUMENTS

Patent Document 1 is Japanese Patent Application Laid-Open (kokai) No. H05-195843

Patent Document 2 is Japanese Patent No. 3339107.

BRIEF SUMMARY OF THE INVENTION

However, the above-described anomaly detection apparatus has a problem in that an expensive resistor element must be provided as a current detection resistor and therefore the production cost of the apparatus increases.

Also, since the current detection resistor is connected in parallel to the switching element, even when the switching element is in an off state, current always flows from a battery, which is a power supply, through the current detection resistor. Therefore, the power of the battery is consumed uselessly, thereby failing to fulfill recent needs of the automotive industry, such as reduction of power consumption.

In view of the foregoing, an object of the present invention is to provide a load drive apparatus which can judge deterioration of an electrical load while employing a configuration which can suppress an increase in production cost and suppress useless power consumption.

A load drive apparatus according to a first aspect of the present invention includes an application voltage control section, a current supply section, and an anomaly judgment section, and drives and controls an electrical load.

The application voltage control section applies to the electrical load a pulse voltage alternately assuming a high potential and a low potential. Namely, in the load drive apparatus, the electrical load is driven and controlled as a result of application of a pulse voltage to the electrical load by the application voltage control section.

The current supply section is configured to supply an anomaly judgment current to the electrical load when the pulse voltage assumes the low potential. The anomaly judgment section is configured to judge whether or not the electrical load is in any of a plurality of anomalous states on the basis of an electrical characteristic of the electrical load at the time when the anomaly judgment current is supplied to the electrical load, the plurality of anomalous states including at least a deteriorated state of the electrical load and one or more wiring anomalous states of the electrical load.

In this load drive apparatus, the anomalous state is judged on the basis of the electrical characteristic of the electrical load at the time when the anomaly judgment current is supplied by the current supply section, instead of the electrical characteristic of the electrical load at the time when the pulse voltage of high potential is applied to the electrical load.

Namely, the electrical characteristic of the electrical load upon supply of the anomaly judgment current is detected in a state in which the influence of the pulse voltage of high potential for driving the electrical load is removed. Therefore, the detected electrical characteristic corresponds to (represents) the actual state of the electrical load. Therefore, use of this load drive apparatus allows detection of a state (for example, a deteriorated sate) of the electrical load which is difficult to detect when the pulse voltage of high potential is applied to the electrical load.

Also, since this load drive apparatus eliminates the necessity of a current detection resistor which would otherwise be connected in series to the electrical load and in parallel to the application voltage control section, an increase in production cost caused by an expensive current detection resistor can be suppressed. Further, since this load drive apparatus is configured to detect the deteriorated state and the wiring anomalous states of the electrical load by instantaneously supplying the anomaly judgment current, the load drive apparatus can realize a configuration which eliminates the necessity of always supplying current to the electrical load for detection of the deteriorated state and the wiring anomalous states of the electrical load.

Therefore, this load drive apparatus can judge the deteriorated state of the electrical load while employing a configuration which can suppress an increase in production cost and can suppress useless power consumption.

Next, in the above-described load drive apparatus, the electrical load may be a heater which generates heat when energized, the electrical characteristic of the electrical load may be the electrical resistance of the electrical load, and the anomaly judgment section compares the electrical resistance of the electrical load to three predetermined thresholds and judges whether or not the electrical load is in any of the plurality of anomalous states on the basis of the comparison between the electrical resistance and the three predetermined thresholds.

The three thresholds are a first threshold, a second threshold, and a third threshold, which differ from one another, with the first threshold being the smallest among the three thresholds, and the third threshold being the largest among the three thresholds. In other words, the three thresholds are a first threshold, the second threshold greater than the first threshold, and a third threshold greater than the second threshold.

The anomaly judgment section judges that the electrical load is in a short-to-ground anomalous state when the electrical resistance of the electrical load is equal to or less than the first threshold, the short-to-ground anomalous state being one of the one or more wiring anomalous state of the electrical load in which opposite ends of the electrical load are connected to the low potential. Also, the anomaly judgment section judges that the electrical load is in a normal state when the electrical resistance of the electrical load is greater than the first threshold and is equal to or less than the second threshold. Further, the anomaly judgment section judges that the electrical load is in the deteriorated state when the electrical resistance of the electrical load is greater than the second threshold and is equal to or less than the third threshold, the deteriorated state being one of the plurality of anomalous states in which the electrical load is deteriorated. In other words, when the electrical resistance is equal to or less than the first threshold, the anomaly judgment section judges that the anomalous state is a short-to-ground anomalous state which is one of the wiring anomalous states of the electrical load and in which opposite ends of the electrical load are connected to the low potential. Also, when the electrical resistance is greater than the first threshold and is equal to or less than the second threshold, the anomaly judgment section judges that the electrical load is a normal state. Further, when the electrical resistance is greater than the second threshold and is equal to or less than the third threshold, the anomaly judgment section judges that the anomalous state is the deteriorated state in which the electrical load is deteriorated.

Also, the anomaly judgment section judges that the electrical load is in a particular anomalous state when the electrical resistance of the electrical load is greater than the third threshold, the particular anomalous state being one of the one or more wiring anomalous states of the electrical load and which includes at least one of a short-to-power anomalous state in which the opposite ends of the electrical load are connected to the high potential and a wire breakage anomalous state in which an energization path for applying the pulse voltage to the electrical load is broken. In other words, when the electrical resistance is greater than the third threshold, the anomaly judgment section judges that the anomalous state is a particular anomalous state which is one of the wiring anomalous states of the electrical load. Notably, the particular anomalous state includes at least one of a short-to-power anomalous state in which the opposite ends of the electrical load are connected to the high potential and a wire breakage anomalous state in which an energization path for applying the pulse voltage to the electrical load is broken.

Namely, in the case where the electrical load is a heater and the electrical characteristic of the electrical load is the electrical resistance of the electrical load, the electrical resistance of the electrical load upon supply of the anomaly judgment current assumes the smallest value when the anomalous state is the short-to-ground anomalous state, assumes a larger value when the heater is in the normal state, assumes a much larger value when the anomalous state is the deteriorated state, and assumes the largest value when the anomalous state is the particular anomalous state.

Therefore, it is possible to judge whether or not any of a plurality of anomalous states of the electrical load has occurred (whether the electrical load is in the normal state or in one of the plurality of anomalous state) and determine the type of the anomalous state (the short-to-ground anomalous state, the deteriorated state, or the particular anomalous state) on the basis of the results of the comparison between the electrical resistance and the three thresholds.

Particularly, this load drive apparatus can judge the deteriorated state of the electrical load without use of a current detection resistor which is connected in series to the electrical load and in parallel to the application voltage control section.

Therefore, this load drive apparatus can judge the deteriorated state of the electrical load while employing a configuration which can suppress an increase in production cost and can suppress useless power consumption.

Notably, the first threshold, the second threshold, and the third threshold may be set on the basis of, for example, measurement results obtained by measuring the electrical resistance of the electrical load in the short-to-ground anomalous state, the normal state, the deteriorated state, and the particular anomalous state. Namely, in one example, a boundary value between the electrical resistance of the electrical load in the short-to-ground anomalous state and the electrical resistance of the electrical load in the normal state is set to be used as the first threshold, a boundary value between the electrical resistance of the electrical load in the normal state and the electrical resistance of the electrical load in the deteriorated state is set to be used as the second threshold, and a boundary value between the electrical resistance of the electrical load in the deteriorated state and the electrical resistance of the electrical load in the particular anomalous state is set to be used as the third threshold.

Next, in the above-described load drive apparatus, upon judging that the electric load is in the particular anomalous state (i.e., in the case where the electrical resistance is greater than the third threshold), the anomaly judgment section may compare the voltage between the opposite ends of the electrical load with a predetermined particular anomaly judgment value when the pulse voltage assumes the low potential or when the control of the pulse voltage by the application voltage control section is not performed. On the basis of the results of the comparison between the voltage between the opposite ends of the electrical load and the particular anomaly judgment value, the anomaly judgment section judges that the electrical load is in the short-to-power anomalous state when the voltage between the opposite ends of the electrical load is greater than the particular anomaly judgment value or that the electrical load is in the wire breakage anomalous state when the voltage between the opposite ends of the electrical load is equal to or less than the particular anomaly judgment value.

Namely, in the case where the pulse voltage assumes the low potential or the control of the pulse voltage by the application voltage control section is not performed, the voltage between the opposite ends of the electrical load assumes a smaller value when the wire breakage anomalous state has occurred, as compared with the case where the short-to-power anomalous state has occurred. Therefore, the judgment as to whether the particular anomalous state is the short-to-power anomalous state or the wire breakage anomalous state can be made on the basis of the results of the comparison between the voltage between the opposite ends of the electrical load and the particular anomaly judgment value.

Therefore, according to this load drive apparatus, in the case where the electrical load is judged to be in the particular anomalous state, it is possible to determine whether the particular anomalous state is the short-to-power anomalous state or the wire breakage anomalous state.

Notably, the particular anomaly judgment value may be set on the basis of, for example, measurement results obtained by measuring the voltage between the opposite ends of the electrical load in the short-to-power anomalous state and the wire breakage anomalous state. Namely, in one example, a boundary value between the voltage between the opposite ends of the electrical load in the short-to-power anomalous state and the voltage between the opposite ends of the electrical load in the wire breakage anomalous state is set to be used as the particular anomaly judgment value.

According to the load drive apparatus of the present invention, it is possible to judge the deteriorated state of the electrical load while employing a configuration which can suppress an increase in production cost and suppress useless power consumption.

DETAILED DESCRIPTION OF EXEMPLARY EMBODIMENTS OF THE INVENTION

Embodiments to which the present invention is applied will be described with reference to the drawings.

Notably, needless to say, the present invention is not limited to the following embodiments, and various forms may be employed so long as they fall within the technical scope of the present invention.

A. First Embodiment 1-1. Overall Configuration

Figure 1:
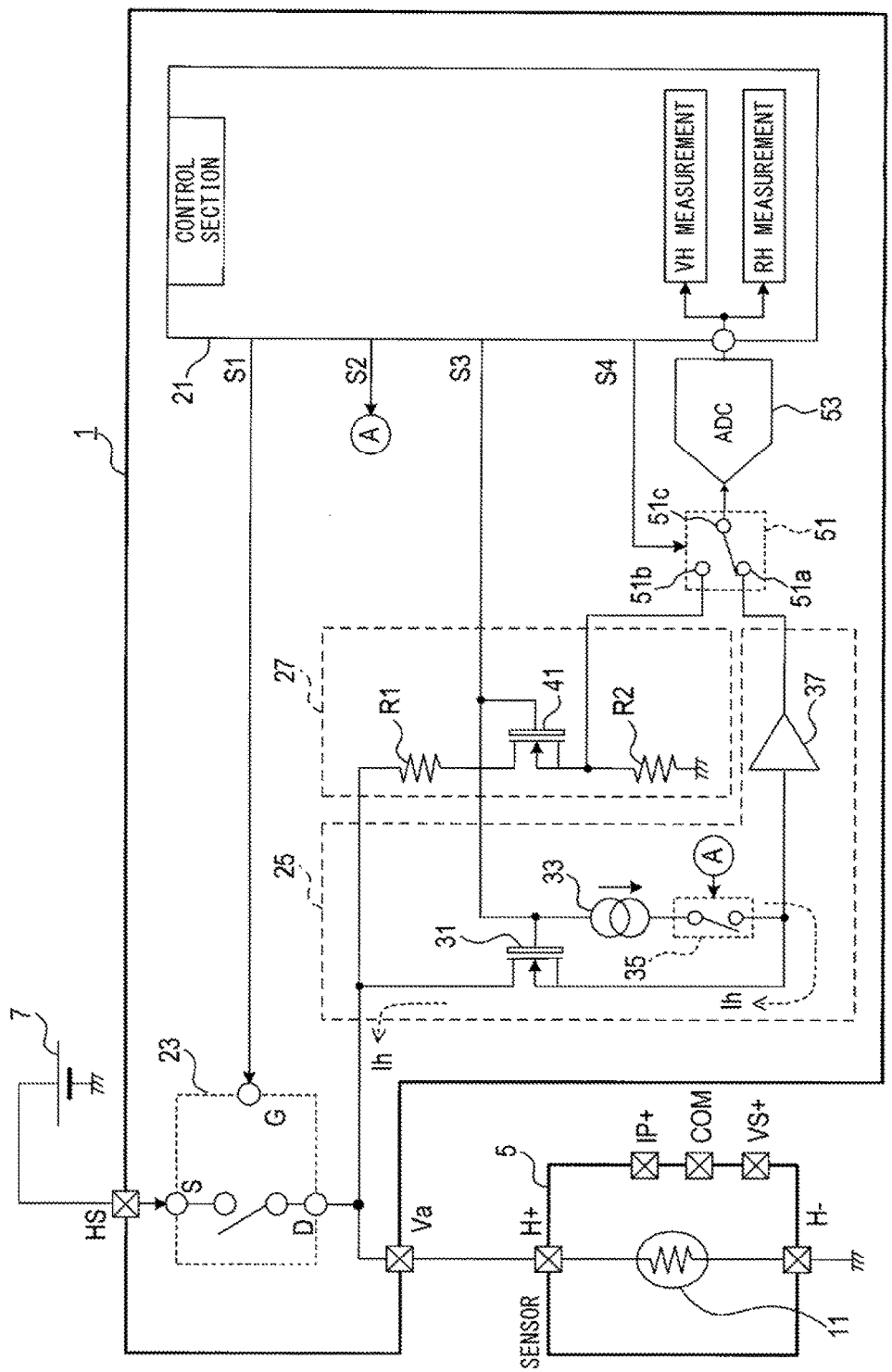
FIG. 1 is an overall diagram of a load drive apparatus.

FIG. 1 is an overall diagram of a load drive apparatus 1 according to an embodiment of the present invention.

The load drive apparatus 1 is used for various purposes, for example, for driving and controlling a heater 11 which heats a detection element (not shown) of a gas sensor 5, for example, in a gas detection apparatus (not shown) which includes the gas sensor 5 and a sensor control section (not shown).

Notably, the gas sensor 5 is an oxygen sensor used for detection of oxygen, and the detection element is mainly made of a solid electrolyte material such as zirconia. The heater 11 is a heater composed of a heat generation resistor which generates heat when energized, and is provided so as to heat the detection element to a predetermined activation temperature (target temperature). Of terminals provided at opposite ends of the heater 11, a high potential terminal H+ is connected to a heater connection terminal Va, and a low potential terminal H− is connected to a ground line (GND potential).

The gas sensor 5 is provided on, for example, an exhaust pipe of an internal combustion engine (engine) and is used to detect the concentration of oxygen contained in exhaust gas in a width range. The gas sensor 5 is also called a linear lambda sensor.

The gas sensor 5 has a plurality of terminals (IP+ terminal, COM terminal, Vs+ terminal) connected to the detection element. These terminals are connected to the sensor control section for the purpose of gas detection. Notably, the detailed description of the structures of the gas sensor 5 and the detection element is omitted herein.

The load drive apparatus 1 is an apparatus for applying a battery voltage VB (e.g., 12 V) output from a battery 7 to the heater 11 of the gas sensor 5. The load drive apparatus 1 controls the amount of electric power supplied to the heater 11 through PWM control of the voltage applied to the heater 11, to thereby control the amount of heat generated by the heater 11. In other words, the load drive apparatus 1 drives and controls the heater 11 in such a manner that the temperature of the detection element of the gas sensor 5 approaches the activation temperature (target temperature) or is maintained at the activation temperature.

The load drive apparatus 1 includes a control section 21, a switching section 23, a current supply section 25, a voltage judgment section 27, a changeover switch section 51, and an AD conversion section 53.

The control section 21 is an electronic control unit (ECU) including a known microcomputer which has a RAM, a ROM, a CPU, etc. (not shown).

The switching section 23 is composed of a P-type power MOSFET. The source S of the MOSFET is connected to a battery connection terminal HS, the gate G of the MOSFET is connected to the control section 21, and the drain D of the MOSFET is connected to the heater connection terminal Va. The switching section 23 is configured to switch its state in accordance with a first signal S1 from the control section 21 between an ON state in which the switching section 23 establishes electrical connection between the source S and the drain D and an OFF state in which the switching section 23 does not establish electrical connection between the source S and the drain D. Notably, in FIG. 1, the switching section 23 is schematically illustrated.

The current supply section 25 includes a first switching element 31, a current generation section 33, a current supply switch 35, and an amplifier 37.

The first switching element 31 is composed of an FET. The gate of the first switching element 31 is connected to an output terminal of the control section 21 from which a third signal S3 is output, the drain of the first switching element 31 is connected to the heater 11 through the heater connection terminal Va, and the source of the first switching element 31 is connected to the current generation section 33 through the current supply switch 35. Notably, the source of the first switching element 31 is also connected to an input terminal of the amplifier 37.

The current generation section 33 is composed of a current source for generating constant current, and generates an anomaly judgment current Ih (e.g., 10 mA) which is supplied to the heater 11 in order to judge whether or not the heater 11 is anomalous. Namely, the current generation section 33 instantaneously supplies the anomaly judgment current Ih to the heater 11 through the current supply switch 35 and the first switching element 31. A method of realizing the instantaneous supply of the anomaly judgment current Ih will be described later.

The current supply switch 35 is configured to switch its state in accordance with a second signal S2 from the control section 21 between an ON state in which the current supply switch 35 establish electrical connection between the current generation section 33 and the source of the first switching element 31 and an OFF state in which the current supply switch 35 does not establish electrical connection between the current generation section 33 and the source of the first switching element 31.

The amplifier 37 amplifies an input potential input to its input terminal and outputs the amplified potential (output potential) from its output terminal to a first input terminal 51a of the changeover switch section 51.

In the current supply section 25, when the current supply switch 35 is controlled to the ON state by the second signal S2 from the control section 21 and the third signal S3 is controlled to a high level, the anomaly judgment current Ih output from the current generation section 33 is supplied to the heater 11 through the current supply switch 35, the first switching element 31, and the heater connection terminal Va. Notably, at that time, the first switching element 31 becomes the ON state due to the potential difference between the gate and the source. Therefore, the first switching element 31 allows the flow of the anomaly judgment current Ih from the source toward the drain.

When the anomaly judgment current Ih is supplied to the heater 11, a voltage determined by the electrical resistance RH of the heater 11 and the anomaly judgment current Ih is generated between the opposite ends of the heater 11. At that time, the potential at the connection point between the source of the first switching element 31 and the current supply switch 35 changes in accordance with the voltage between the opposite ends of the heater 11, and the output potential of the amplifier 37 changes in accordance with the voltage between the opposite ends of the heater 11.

Notably, since the electrical resistance RH of the heater 11 changes in accordance with the state (deteriorated state) of the heater 11, the output potential of the amplifier 37 when the anomaly judgment current Ih is supplied changes in accordance with the state (deteriorated state) of the heater 11. The electrical resistance RH of the heater 11 can be computed on the basis of the current value of the anomaly judgment current Ih, the output potential of the amplifier 37, the amplification factor of the amplifier 37, etc.

In the case where a GND short anomaly of the heater 11 occurs, the potential at the connection point between the source of the first switching element 31 and the current supply switch 35 upon supply of the anomaly judgment current Ih becomes equal to a low potential (about 1 mV in the present embodiment) which corresponds to the voltage generated between the drain and source of the first switching element 31. Notably, the GND short anomaly of the heater 11 is an anomalous state in which the high potential terminal H+ of the heater 11 which is connected to the heater connection terminal Va is connected to the ground line (GND potential).

In the case where a battery short anomaly of the heater 11 or a wire breakage anomaly of the heater 11 occurs, the potential at the connection point between the source of the first switching element 31 and the current supply switch 35 upon supply of the anomaly judgment current Ih becomes equal to a potential (about 3.3 V in the present embodiment) which corresponds to the high-level potential of the third signal S3 output from the control section 21.

Notably, the battery short anomaly of the heater 11 is an anomalous state in which the high potential terminal H+ of the heater 11 which is connected to the heater connection terminal Va is always connected to a positive electrode potential line of the battery 7 (potential corresponding to the battery voltage VB). Also, the wire breakage anomaly of the heater 11 is an anomalous state in which the energization path extending from the heater connection terminal Va to the ground line through the high potential terminal H+ and the heater 11 is broken at a certain location.

Notably, in the case where the battery short anomaly of the heater 11 occurs, the potential of the heater connection terminal Va may become equal to the potential of the positive electrode potential line of the battery 7 which is the highest potential. However, the potential input to the amplifier 37 is restricted by the first switching element 31 to a potential corresponding to the high-level potential of the third signal S3. As a result, the potential input to the amplifier 37 is prevented from becoming a high potential such as that of the positive electrode potential line of the battery 7, whereby breakage of the amplifier 37 due to application of high voltage can be prevented.

Namely, the current supply section 25 is configured to instantaneously supply the anomaly judgment current Ih to the heater 11 and output to the first input terminal 51a of the changeover switch section 51 an output potential corresponding to the state (deteriorated state) of the heater 11 at that time or the anomalous state (the GND short anomalous state of the heater 11, the battery short anomalous state of the heater 11, or the wire breakage anomalous state of the heater 11).

The voltage judgment section 27 includes a second switching element 41, a first resistor element R1, and a second resistor element R2.

The second switching element 41 is composed of an FET. The gate of the second switching element 41 is connected to the output terminal of the control section 21 from which the third signal S3 is output, the drain of the second switching element 41 is connected to the heater 11 through the first resistor element R1 and the heater connection terminal Va, and the source of the second switching element 41 is connected to the ground line through the second resistor element R2. Notably, the source of the second switching element 41 is also connected to a second input terminal 51b of the changeover switch section 51.

The second switching element 41 becomes an ON state when the third signal S3 becomes the high-level potential and becomes an OFF state when the third signal S3 becomes the low-level potential.

Therefore, for example, in the case of the battery short anomaly of the heater 11, when the second switching element 41 becomes the ON state, a current flows from the heater 11 to the ground line through the first resistor element R1, the second switching element 41, and the second resistor element R2, whereby a voltage is generated across the second resistor element R2. Also, for example, in the case of the wire breakage anomaly of the heater 11, even when the second switching element 41 becomes the ON state, no current flows through the first resistor element R1, the second switching element 41, and the second resistor element R2, and no voltage is generated across the second resistor element R2.

Namely, the voltage generated across the second resistor element R2 assumes different values between the case where the battery short anomaly of the heater 11 occurs and the case where the wire breakage anomaly of the heater 11 occurs. Also, since the voltage generated across the second resistor element R2 changes in accordance with the voltage between the opposite ends of the heater 11, the voltage between the opposite ends of the heater 11 can be detected on the basis of the voltage generated across the second resistor element R2.

The connection point between the source of the second switching element 41 and the second resistor element R2 is connected to the second input terminal 51b of the changeover switch section 51, and the voltage judgment section 27 outputs to the second input terminal 51b of the changeover switch section 51 an output potential corresponding to the potential generated across the second resistor element R2.

Namely, the voltage judgment section 27 is configured such that when the third signal S3 is controlled to the high-level potential and the second switching element 41 becomes the ON state, the voltage judgment section 27 outputs to the second input terminal 51b of the changeover switch section 51 an output potential corresponding to the battery short anomalous state of the heater 11 or the wire breakage anomalous state of the heater 11.

The changeover switch section 51 has two input terminals (the first input terminal 51a and the second input terminal 51b) and a single output terminal 51c. The changeover switch section 51 is configured to switch the input terminal to be connected to the output terminal 51c between the first input terminal 51a and the second input terminal 51b on the basis of a fourth signal S4 output from the control section 21. Namely, the changeover switch section 51 is configured to selectively establish connection between the current supply section 25 and the AD conversion section 53 and connection between the voltage judgment section 27 and the AD conversion section 53 on the basis of the fourth signal S4 output from the control section 21.

The AD conversion section 53 is configured to convert an input analog signal to a digital signal and outputs the digital signal to the control section 21.

1-2. Control Section:

The control section 21 executes various types of control processes such as gas detection processing, heater energization processing, and heater anomaly judgment processing.

The gas detection processing is processing of driving and controlling the detection element of the gas sensor 5 to thereby detect a particular gas (oxygen) contained in a gas under measurement (exhaust gas, etc.). For example, the gas detection processing executes processing for the gas sensor 5 in order to perform pumping (pumping in or pumping out) of oxygen such that the oxygen concentration within a measurement chamber into which exhaust gas has been introduced becomes equal to a predetermined target concentration (e.g., an oxygen concentration corresponding to the theoretical air-fuel ratio) and linearly detect the concentration of oxygen contained in the gas under measurement on the basis of a pump current Ip used for the pumping of oxygen.

The heater energization processing is processing of outputting, as a voltage applied to the heater 11, a pulse voltage which alternately assumes a high-level potential (e.g., a potential corresponding to the battery voltage VB) and a low-level potential (e.g., the ground potential (0 V)) and controlling the voltage applied to the heater 11, by means of PWM control, such that the temperature of the detection element of the gas sensor 5 approaches the activation temperature (the target temperature) or is maintained at the activation temperature. Namely, in the heater energization processing, the duty ratio of the voltage (pulse voltage) applied to the heater 11 is controlled in accordance with the difference between the temperature of the detection element of the gas sensor 5 and the target temperature, so that the temperature of the detection element of the gas sensor 5 approaches the activation temperature (the target temperature).

1-3. Heater Anomaly Judgment Processing:

Next, the heater anomaly judgment processing will be described.

Figure 2:
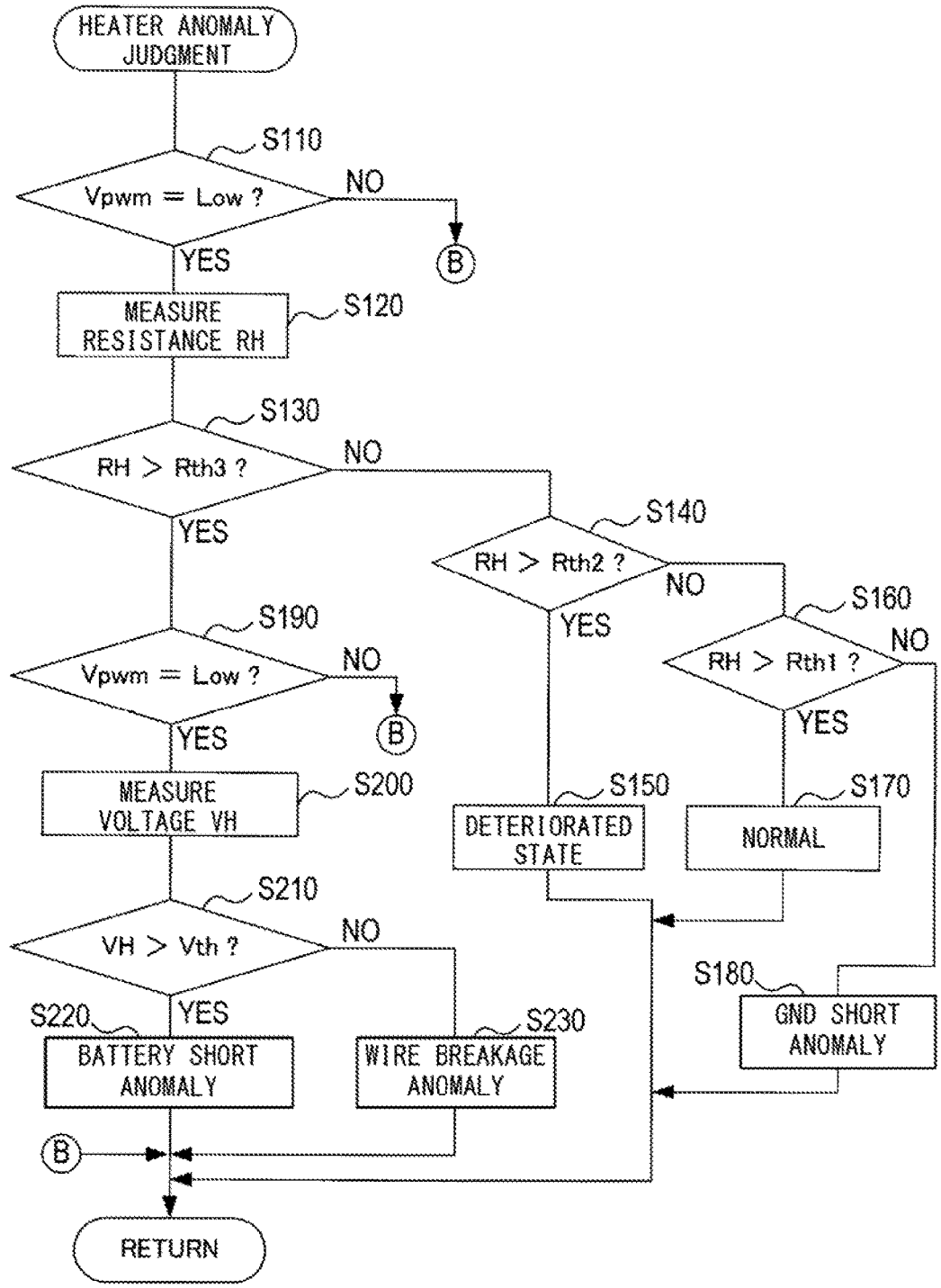
FIG. 2 is a flowchart showing the details of heater anomaly judgment processing.

FIG. 2 shows a flowchart representing the details of the heater anomaly judgment processing. Notably, the heater anomaly judgment processing is repeatedly executed at predetermined intervals.

When the heater anomaly judgment processing is started, in S110 (S stands for "step"), the control section 21 first judges whether or not the voltage Vpwm applied to the heater 11 by the heater energization processing is the low-level potential. When the control section 21 makes an affirmative judgment, the control section 21 proceeds to S120. When the control section 21 makes a negative judgment, the control section 21 ends the present processing (the heater anomaly judgment processing).

When the control section 21 proceeds to S120 as a result of the affirmative judgment in S110, in S120, the control section 21 executes processing of measuring the electrical resistance RH of the heater 11 through use of the current supply section 25.

Specifically, the control section 21 outputs the second signal S2 to the current supply switch 35 so as to control the current supply switch 35 to the ON state, and outputs the fourth signal S4 to the changeover switch section 51 such that the changeover switch section 51 establishes the connection between the current supply section 25 and the AD conversion section 53. Also, the control section 21 outputs the third signal S3 having a high-level potential to the first switching element 31 of the current supply section 25 so as to control the first switching element 31 to the ON state.

As a result of the output of the second signal S2 for bringing the current supply switch 35 into the ON state and the output of the third signal S3 for bringing the first switching element 31 into the ON state, the current supply switch 35 and the first switching element 31 of the current supply section 25 are controlled to their ON states. As a result, the anomaly judgment current Ih output from the current generation section 33 is supplied to the heater 11 through the current supply switch 35, the first switching element 31, and the heater connection terminal Va.

The output potential of the amplifier 37 upon supply of the anomaly judgment current Ih is input to the AD conversion section 53 through the changeover switch section 51, is converted to a digital value by the AD conversion section 53, and the digital value is input to the control section 21. The control section 21 computes the electrical resistance RH of the heater 11 on the basis of pieces of information, such as the current value of the anomaly judgment current Ih, the output potential of the amplifier 37, and the amplification factor of the amplifier 37, and a predetermined computation expression, a map, or the like. Notably, the supply of the anomaly judgment current Ih is instantaneous supply which becomes necessary at the time of computation of the electrical resistance RH of the heater 11 at S120. Therefore, after having obtained the AD-converted value from the AD conversion section 53, the control section 21 outputs the second signal S2 so as to control the current supply switch 35 to the OFF state and outputs the third signal S3 so as to control the first switching element 31 to the OFF state.

In the next step; i.e., S130, the control section 21 judges whether or not the electrical resistance RH of the heater 11 measured in S120 is greater than a predetermined third threshold Rth3. When the control section 21 makes an affirmative judgment, the control section 21 proceeds to S190. When the control section 21 makes a negative judgment, the control section 21 proceeds to S140.

Notably, a boundary value (20Ω in present embodiment) between the electrical resistance RH of the heater 11 in the deteriorated state and the electrical resistance RH of the heater 11 in a particular anomalous state (the battery short anomalous state or the wire breakage anomalous state) is set as the third threshold Rth3.

When the control section 21 proceeds to S140 as a result of the negative judgment in S130, in S140, the control section 21 judges whether or not the electrical resistance RH of the heater 11 measured in S120 is greater than a predetermined second threshold Rth2. When the control section 21 makes an affirmative judgment, the control section 21 proceeds to S150. When the control section 21 makes a negative judgment, the control section 21 proceeds to S160.

Notably, a boundary value (16Ω in present embodiment) between the electrical resistance RH of the heater 11 in the deteriorated state and the electrical resistance RH of the heater 11 in the normal state is set as the second threshold Rth2.

When the control section 21 proceeds to S150 as a result of the affirmative judgment in S140, in S150, the control section 21 determines that the heater 11 is in the deteriorated state.

When the control section 21 proceeds to S160 as a result of the negative judgment in S140, in S160, the control section 21 judges whether or not the electrical resistance RH of the heater 11 measured in S120 is greater than a predetermined first threshold Rth1. When the control section 21 makes an affirmative judgment, the control section 21 proceeds to S170. When the control section 21 makes a negative judgment, the control section 21 proceeds to S180.

Notably, a boundary value (2Ω in present embodiment) between the electrical resistance RH of the heater 11 in the normal state and the electrical resistance RH of the heater 11 in the GND short anomalous state is set as the first threshold Rth1.

The values of the first threshold Rth1, the second threshold Rth2, and the third threshold Rth3 are set on the basis of measurement results obtained by measuring the electrical resistance RH of the heater 11 in each of the GND short anomalous state, the normal state, the deteriorated state, and the particular anomalous state.

When the control section 21 proceeds to S170 as a result of the affirmative judgment in S160, in S170, the control section 21 determines that the heater 11 is in the normal state.

When the control section 21 proceeds to S180 as a result of the negative judgment in S160, in S180, the control section 21 determines that the heater 11 is in the GND short anomalous state.

When the control section 21 proceeds to S190 as a result of the affirmative judgment in S130, in S190, the control section 21 judges whether or not the voltage Vpwm applied to the heater 11 by the heater energization processing is the low-level potential. When the control section 21 makes an affirmative judgment, the control section 21 proceeds to S200. When the control section 21 makes a negative judgment, the control section 21 ends the present processing (the heater anomaly judgment processing).

When the control section 21 proceeds to S200 as a result of the affirmative judgment in S190, in S200, the control section 21 executes processing of measuring the voltage VH between the opposite ends of the heater 11 through use of the voltage judgment section 27.

Specifically, the control section 21 outputs the third signal S3 having the high-level potential to the second switching element 41 so as to control the second switching element 41 to the ON state and outputs the fourth signal S4 to the changeover switch section 51 such that the changeover switch section 51 establishes the connection between the voltage judgment section 27 and the AD conversion section 53. Notably, at that time, the first switching element 31 is also controlled to the ON state. However, since the current supply switch 35 is in the OFF state, the anomaly judgment current Ih is not supplied to the heater 11.

As a result of the output of the third signal S3 having the high-level potential, the second switching element 41 of the voltage judgment section 27 is controlled to the ON state, whereby the energization path which extends from the heater 11 to the ground line (the GND potential) through the first resistor element R1, the second switching element 41, and the second resistor element R2 is formed.

Since the voltage judgment section 27 is connected to the AD conversion section 53 as a result of the output of the fourth signal S4, an output potential (analog value) corresponding to the voltage generated across the second resistor element R2 is input to the AD conversion section 53 through the changeover switch section 51. The AD-converted output potential (digital value) output from the AD conversion section 53 is input to the control section 21. Notably, after the control section 21 has obtained this output potential, it is unnecessary to control the second switching element 41 to the ON state. Therefore, the control section 21 outputs the third signal S3 such that the second switching element 41 is controlled to the OFF state (outputs the third signal S3 having a low-level potential to the second switching element 41). The control section 21 computes the voltage VH between the opposite ends of the heater 11 on the basis of the information of the output potential (digital value) corresponding to the voltage across the second resistor element R2, and a predetermined computation expression, a map or the like.

In the next step; i.e., S210, the control section 21 judges whether or not the voltage VH between the opposite ends of the heater 11 measured in S200 is greater than a predetermined particular anomaly judgment value Vth. When the control section 21 makes an affirmative judgment, the control section 21 proceeds to S220. When the control section 21 makes a negative judgment, the control section 21 proceeds to S230.

Notably, the particular anomaly judgment value Vth is set in advance on the basis of measurement results obtained by measuring the voltage between the opposite ends of the heater 11 through use of the voltage judgment section 27 when the battery short anomaly of the heater 11 occurred and when the wire breakage anomaly of the heater 11 occurred. Namely, a boundary value (5.0 V in the present embodiment) between the voltage between the opposite ends of the heater 11 at the time of the battery short anomaly of the heater 11 and the voltage between the opposite ends of the heater 11 at the time of the wire breakage anomaly of the heater 11 is set as the particular anomaly judgment value Vth.

When the control section 21 proceeds to S220 as a result of the affirmative judgment in S210, in S220, the control section 21 determines that the heater 11 is in the battery short anomalous state.

When the control section 21 proceeds to S230 as a result of the negative judgment in S210, in S230, the control section 21 determines that the heater 11 is in the wire breakage anomalous state.

When the processing of S150, S170, S180, S220, or S230 ends, the control section 21 ends the present processing (the heater anomaly judgment processing).

As described above, in the heater anomaly judgment processing, when the voltage Vpwm applied to the heater 11 is the low-level potential (affirmative judgment in S110), the anomaly judgment current Ih is supplied to the heater 11, and the electrical resistance RH of the heater 11 is measured (S120).

Then, a judgment as to whether or not a deteriorated state of the heater 11 has occurred and a judgment as to whether or not an anomalous state of the heater 11 has occurred are made on the basis of the electrical resistance RH of the heater 11 upon supply of the anomaly judgment current Ih. Specifically, the judgment as to whether or not any of anomalous states of the heater 11 has occurred is made on the basis of the results of the comparison between the electrical resistance RH of the heater 11 and three thresholds (the first threshold Rth1, the second threshold Rth2, and the third threshold Rth3). The anomalous states which are judged on the basis of the results of the comparison include the deteriorated state (S150), the GND short anomalous state (S180), and the particular anomalous state (the battery short anomalous state (S220) and the wire breakage anomalous state (S230)).

In the case where the control section 21 judges that the particular anomalous state (the battery short anomalous state or the wire breakage anomalous state) has occurred (affirmative judgment in S130), the control section 21 judges whether the particular anomalous state is the battery short anomalous state (S220) or the wire breakage anomalous state (S230) on the basis of the results of the comparison between the particular anomaly judgment value Vth and the voltage VH between the opposite ends of the heater 11 measured in S200.

Figure 3:
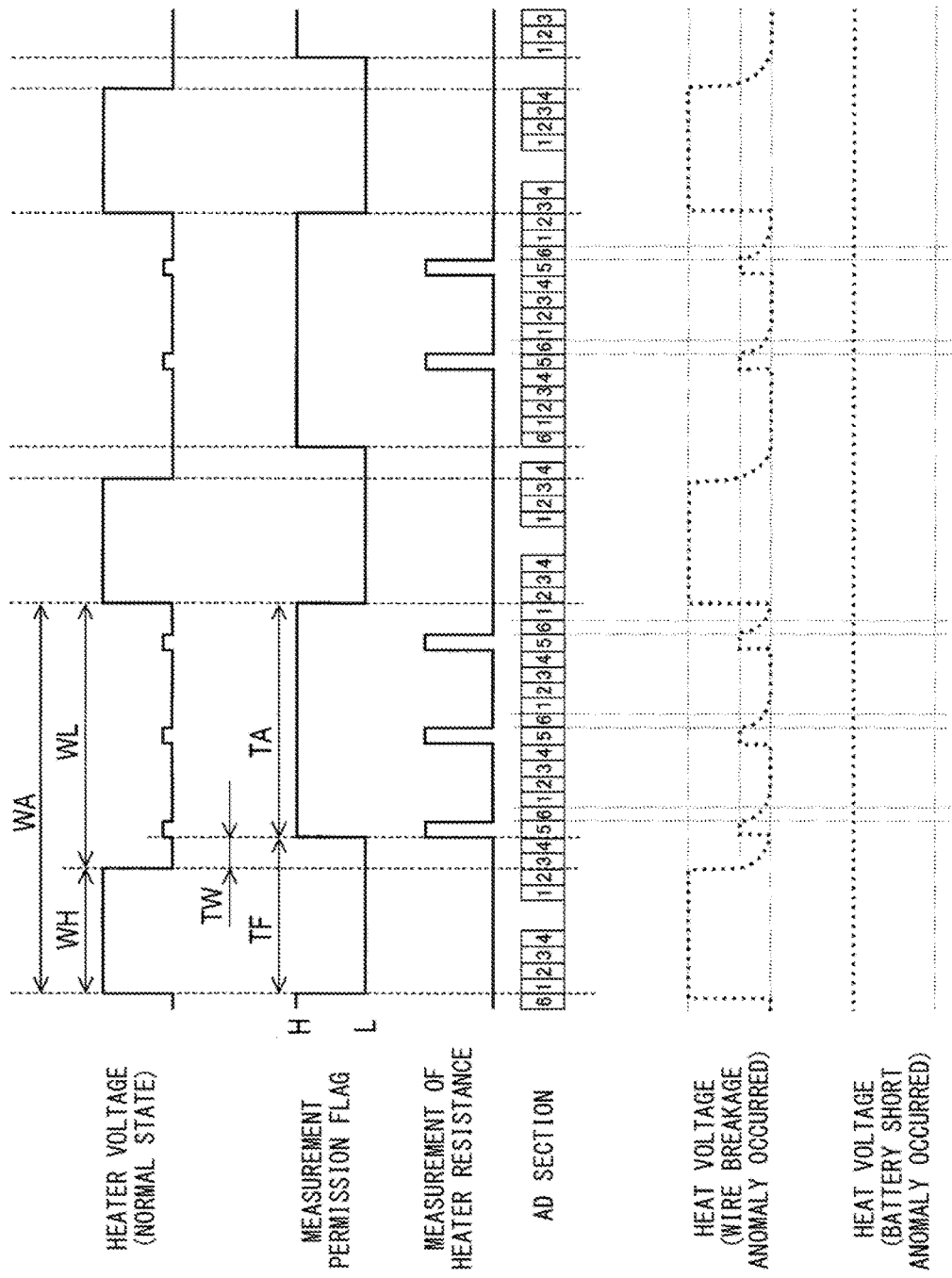
FIG. 3 is a time chart showing the states of various portions regarding the load drive apparatus.

FIG. 3 is a time chart showing the states of various portions regarding the load drive apparatus 1 of the present embodiment; specifically, the state of the heater voltage (the voltage between the opposite ends of the heater 11), the state of a measurement permission flag, the state of heater resistance measurement, and AD sections.

The heater voltage is the voltage between the opposite ends of the heater 11. When the heater 11 is normal, during a high-level period WH of a single cycle WA of the PWM control, the heater voltage is at a high level because a voltage is applied to the heater 11 through the switching section 23 in the ON state. Also, when the heater 11 is normal, during a low-level period WL of the single cycle WA of the PWM control, the heater voltage is at a low level because the application of the voltage to the heater 11 through the switching section 23 is not performed.

Notably, in addition to the heater voltage at the time when the heater 11 is normal, FIG. 3 shows the heater voltage at the time of the wire breakage anomaly of the heater 11 and the heater voltage at the time of the battery short anomaly of the heater 11 by dashed lines.

The measurement permission flag is a flag which represents whether or not the measurement of the electrical resistance RH of the heater 11 through use of the current supply section 25 and the measurement of the voltage VH between the opposite ends of the heater 11 through use of the voltage judgment section 27 are permitted. Periods during which the measurement permission flag is at the high level are permitted periods TA, and periods during which the measurement permission flag is at the low level are unpermitted periods TF.

Notably, each unpermitted period TF contains not only the high-level period WH of the heater voltage but also a predetermined wait period TW following the end of the high-level period WH. Namely, immediately after the heater voltage is switched from the high level to the low level, a noise component due to voltage fluctuation or the like is generated and the measurement may be adversely affected thereby. Therefore, the influence of the noise component or the like is suppressed by determining the unpermitted periods TF such that each unpermitted period TF contains the wait period TW following the end of the high-level period WH.

The state of heater resistance measurement shows periods during which the electrical resistance RH of the heater 11 is measured through use of the current supply section 25 and periods during which the electrical resistance RH of the heater 11 is not measured. In FIG. 3, the high level represents the periods during which the electrical resistance RH is measured, and the low level represents the periods during which the electrical resistance RH is not measured.

The AD sections show each cycle of AD conversion performed by the AD conversion section 53. In the present embodiment, a cycle having six types of sections (section 1 to section 6) is repeated. The AD conversion in the measurement of the electrical resistance RH of the heater 11 through use of the current supply section 25 is performed in section 5, and the AD conversion in the measurement of the voltage VH between the opposite ends of the heater 11 through use of the voltage judgment section 27 is performed in section 6.

Notably, in the periods during which the measurement permission flag is at the low level (unpermitted periods TF), even when the section 5 or the section 6 comes, the measurement of the electrical resistance RH of the heater 11 or the measurement of the voltage VH between the opposite ends of the heater 11 is not performed. Therefore, in FIG. 3, the sections 5 and 6 during the unpermitted periods TF are omitted.

As shown in FIG. 3, the heater voltage when the heater 11 is normal remains at the high level in the high-level period WH and remains at the low level in the low-level period WL. In each low-level period WL at the time when the heater 11 is normal, the heater voltage slightly changes at points at which the measurement of the heater resistance is performed (when the AD section is the section 5) due to the supply of the anomaly judgment current Ih to the heater 11. Also, in each low-level period WL at the time when the heater 11 is normal, the heater voltage remains at the low level and does not change at points at which the voltage VH between the opposite ends of the heater 11 is measured (when the AD section is the section 6).

Next, the heater voltage at the time when the wire breakage anomaly of the heater 11 has occurred remains at the high level in the high-level period WH, and decreases in the low-level period WL. Specifically, the heater voltage gradually decreases immediately after the start of the low-level period WL and becomes the low level before elapse of the wait period TW.

Also, in each low-level period WL at the time when the wire breakage anomaly of the heater 11 has occurred, the heater voltage assumes a potential corresponding to the high-level potential of the third signal S3 at points at which the measurement of the heater resistance is performed (when the AD section is the section 5) as a result of the instantaneous supply of the anomaly judgment current Ih to the heater 11. Notably, after the end of the heater resistance measurement, the heater voltage gradually decreases and finally becomes the low level.

Further, the heater voltage at the time when the battery short anomaly of the heater 11 has occurred remains at the high level in both of the high-level period WH and the low-level period WL. Also, when the battery short anomaly of the heater 11 has occurred, in the low-level period WL, the heater voltage remains at the high level at both of the points at which the measurement of the heater resistance is performed (when the AD section is the section 5) and the points at which the voltage VH between the opposite ends of the heater 11 is measured (when the AD section is the section 6).

1-4. Effects:

As described above, the load drive apparatus 1 of the present embodiment includes the control section 21, the switching section 23, the current supply section 25, the voltage judgment section 27, the changeover switch section 51, and the AD conversion section 53, and drives and controls the heater 11 of the gas sensor 5.

The control section 21 controls the operation of the switching section 23 by executing the heater energization processing, to thereby apply to the heater 11 a pulse voltage which alternately assumes a high-level potential and a low-level potential. At that time, the control section 21 controls the voltage applied to the heater 11, by means of PWM control, such that the temperature of the detection element of the gas sensor 5 approaches the activation temperature (the target temperature) or is maintained at the activation temperature. Namely, the load drive apparatus 1 drives and controls the heater 11 through use of the control section 21 and the switching section 23 which apply a pulse voltage to the heater 11.

The current supply section 25 controlled by the second signal S2 from the control section 21 instantaneously supplies the anomaly judgment current Ih to the heater 11 when the voltage Vpwm applied to the heater 11 assumes the low-level potential. Subsequently, the control section 21 computes the electrical resistance RH of the heater 11 on the basis of pieces of information, such as the current value of the anomaly judgment current Ih, the output potential of the amplifier 37, and the amplification factor of the amplifier 37, and a predetermined computation expression, a map, or the like (S120).

Further, on the basis of the electrical resistance RH of the heater 11 upon supply of the anomaly judgment current Ih, the control section 21 judges whether or not any of the anomalous states of the heater 11 has occurred. The anomalous states include at least the deteriorated state of the heater 11 and the wiring anomalous states of the heater 11 (the GND short anomalous state, the battery short anomalous state, and the wire breakage anomalous state).

In the load drive apparatus 1, the anomalous state is judged on the basis of the electrical characteristic (the electrical resistance RH) of the heater 11 at the time when the anomaly judgment current Ih is supplied by the current supply section 25, instead of the electrical characteristic (the electrical resistance RH) of the heater 11 at the time when the high-level voltage Vpwm is applied to the heater 11.

Namely, the electrical characteristic of the heater 11 upon supply of the anomaly judgment current Ih is detected in a state in which the influence of the high-level application voltage Vpwm for driving the heater 11 is removed. Therefore, the detected electrical characteristic corresponds to (represents) the actual state of the heater 11. Therefore, use of the load drive apparatus 1 allows detection of a state of the heater 11 which is difficult to detect when the high-level voltage Vpwm is applied to the heater 11.

Also, since the load drive apparatus 1 eliminates the necessity of a current detection resistor which would otherwise be connected in series to the heater 11 and in parallel to the switching section 23, an increase in production cost caused by an expensive current detection resistor can be suppressed. Further, the load drive apparatus 1 can realize a configuration which eliminates the necessity of always supplying current to the heater 11 for detection of the deteriorated state and the wiring anomalous states of the heater 11.

Also, in the load drive apparatus 1, by executing the heater anomaly judgment processing, the control section 21 measures the electrical resistance RH of the heater 11 and judges whether or not an anomalous state of the heater 11 has occurred on the basis of the results of the comparison between the electrical resistance RH and three thresholds (the first threshold Rth1, the second threshold Rth2, and the third threshold Rth3).

In the heater anomaly judgment processing, when the electrical resistance RH is equal to or less than the first threshold Rth1 (negative judgment in S160), the control section 21 judges that the heater 11 is in the GND short anomalous state (S180). Also, in the heater anomaly judgment processing, when the electrical resistance RH is greater than the first threshold Rth1 and equal to or less than the second threshold Rth2 (affirmative judgment in S160), the control section 21 judges that the heater 11 is in the normal state (S170). Further, in the heater anomaly judgment processing, when the electrical resistance RH is greater than the second threshold Rth2 and is equal to or less than the third threshold Rth3 (affirmative judgment in S140), the control section 21 judges that the heater 11 is in the deteriorated state (S150).

Also, in the heater anomaly judgment processing, when the electrical resistance RH is greater than the third threshold Rth3 (affirmative judgment in S130), the control section 21 judges that the heater 11 is in the particular anomalous state (the battery short anomalous state or the wire breakage anomalous state).

In the heater anomaly judgment processing, when the control section 21 judges that the heater 11 is in the particular anomalous state (the battery short anomalous state or the wire breakage anomalous state) (affirmative judgment in S130), the control section 21 judges whether the heater 11 is in the battery short anomalous state (S220) or the wire breakage anomalous state (S230) on the basis of the results of the comparison between the particular anomaly judgment value Vth and the voltage VH between the opposite ends of the heater 11 measured in S200.

Since the heater 11 is composed of a so-called heat generation resistor, the electrical resistance RH of the heater 11 assumes the smallest value when the heater 11 is in the GND short anomalous state, assumes a larger value when the heater 11 is in the normal state, assumes a much larger value when the heater 11 is in the deteriorated state, and assumes the largest value when the heater 11 is in the particular anomalous state. Therefore, it is possible to judge whether or not an anomalous state has occurred (whether the heater 11 is in the normal state or in the anomalous state) and determine the type of the anomalous state (the short-to-ground anomalous state, the deteriorated state, or the particular anomalous state) on the basis of the results of the comparison between the electrical resistance RH and the three thresholds.

Also, in the heater anomaly judgment processing, when the electrical resistance RH is greater than the third threshold Rth3 and the control section 21 judges that the heater 11 is in the particular anomalous state (the battery short anomalous state or the wire breakage anomalous state) (affirmative judgment in S130), the control section 21 measures the voltage VH between the opposite ends of the heater 11 through use of the voltage judgment section 27 (S200) when the voltage Vpwm applied to the heater 11 assumes the low-level potential (affirmative judgment in S190).

The control section 21 compares the voltage VH between the opposite ends of the heater 11 measured in S200 with the particular anomaly judgment value Vth (S210), and judges whether the heater 11 is in the battery short anomalous state (S220) or in the wire breakage anomalous state (S230) on the basis of the results of the comparison. Specifically, in the case where the voltage VH is greater than the particular anomaly judgment value Vth (affirmative judgment in S210), the control section 21 judges that the heater 11 is in the battery short anomalous state, and in the case where the voltage VH is equal to or less than the particular anomaly judgment value Vth (negative judgment in S210), the control section 21 judges that the heater 11 is in the wire breakage anomalous state.

Namely, in the case where the applied voltage Vpwm assumes the low-level potential, the voltage VH between the opposite ends of the heater 11 assumes a smaller value when the wire breakage anomalous state has occurred, as compared with the case where the battery short anomalous state has occurred. Therefore, the judgment as to whether the particular anomalous state is the battery short anomalous state or the wire breakage anomalous state can be made on the basis of the results of the comparison between the voltage VH between the opposite ends of the heater 11 and the particular anomaly judgment value Vth.

Therefore, according to the load drive apparatus 1, in the case where the heater 11 is judged to be in the particular anomalous state, it is possible to judge whether the particular anomalous state is the battery short anomalous state or the wire breakage anomalous state.

1-5. Correspondence Between Embodiment and Claims:

A description will be given of the correspondence between terms used in clams and terms used in the present embodiment.

The heater 11 is an example of the electrical load; the electrical resistance RH is an example of the electrical characteristic of the electrical load; and the application voltage Vpwm is an example of the pulse voltage. The control section 21 which executes the heater energization processing and the switching section 23 are an example of the application voltage control section; the control section 21 which executes S120 of the heater anomaly judgment processing and the current supply section 25 are an example of the current supply section; and the control section 21 which executes S130 to S230 of the heater anomaly judgment processing is an example of the anomaly judgment section.

The GND short anomalous state is an example of the short-to-ground anomalous state; and the battery short anomalous state is an example of the short-to-power anomalous state.

2. Second Embodiment

In the case of the above-described embodiment, in the heater anomaly judgment processing, the measurement of the voltage VH between the opposite ends of the heater 11 (S200) is performed when the voltage Vpwm applied to the heater 11 by the heater energization processing assumes the low-level potential (affirmative judgment in S190). However, the load drive apparatus of the present invention is not limited to such a configuration.

A second load drive apparatus which executes second heater anomaly judgment processing in which the measurement of the voltage VH between the opposite ends of the heater 11 is performed when the heater energization processing is stopped will be described as a second embodiment.

Since the hardware configuration of the second load drive apparatus is identical to that of the above-described load drive apparatus 1, its description is omitted.

Figure 4:
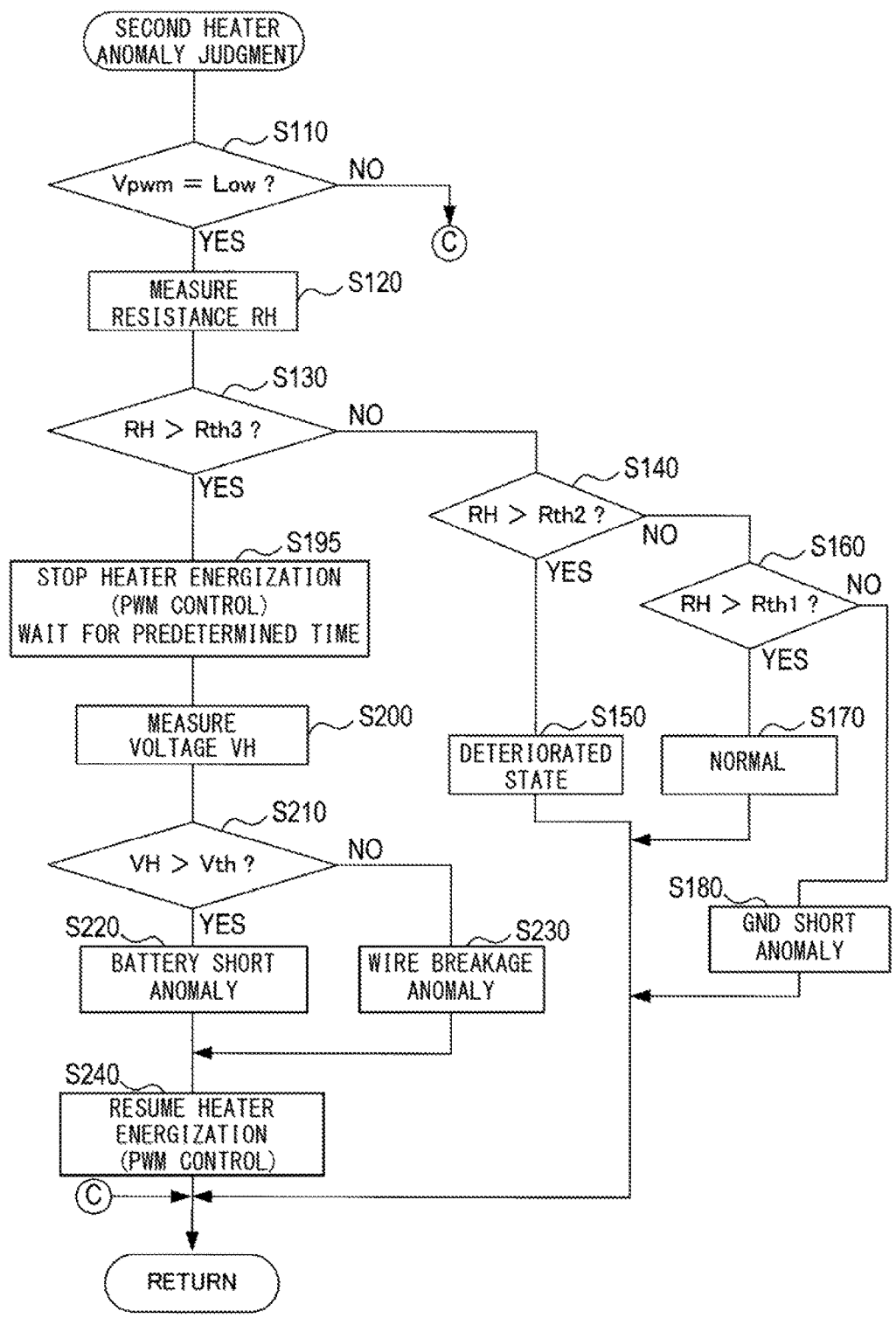
FIG. 4 is a flowchart showing the details of second heater anomaly judgment processing.

FIG. 4 shows a flowchart representing the details of the second heater anomaly judgment processing.

Notably, although the second heater anomaly judgment processing differs from the heater anomaly judgment processing of the above-described embodiment in that S190 is replaced with S195 and S240 is added after S220 or S230, the remaining portion of the processing is identical with that of the heater anomaly judgment processing of the above-described embodiment. Therefore, in the description of the second load drive apparatus, the portions of the second heater anomaly judgment processing which differ from the heater anomaly judgment processing of the above-described embodiment will be mainly described.

In the second heater anomaly judgment processing, in S130, the control section 21 judges whether or not the electrical resistance RH of the heater 11 measured in S120 is greater than the predetermined third threshold Rth3. When the control section 21 makes an affirmative judgment, the control section 21 proceeds to S195. When the control section 21 makes a negative judgment, the control section 21 proceeds to S140.

In the case where the control section 21 proceeds to S195 as a result of the affirmative judgment in S130, in S195, the control section 21 performs processing of stopping the heater energization processing and waiting until a predetermined time (1.0 sec. in the present embodiment) elapses. Namely, the control section 21 stops the application of the voltage Vpwm to the heater 11 (in other words, stops the PWM control of the applied voltage Vpwm) by stopping the heater energization processing and waits for a predetermined time. Notably, by waiting for the predetermined time, the control section 21 prevents a noise component, etc. which are generated due to voltage fluctuation immediately after the stoppage of the applied voltage Vpwm from adversely affecting the measurement of the voltage VH between the opposite ends of the heater 11.

When the processing for waiting in S195 ends, the control section 21 proceeds to S200. In S200, the control section 21 performs processing of measuring the voltage VH between the opposite ends of the heater 11 through use of the voltage judgment section 27. Namely, the control section 21 measures the voltage VH between the opposite ends of the heater 11 in a state in which the application of the voltage Vpwm to the heater 11 is stopped.

Also, in the second heater anomaly judgment processing, when the processing of S220 or S230 ends, the control section 21 proceeds to S240. In S240, the control section 21 performs processing of resuming the heater energization processing. Namely, by resuming the heater energization processing stopped in S195, the control section 21 resumes the duty control of the voltage (pulse voltage) applied to the heater 11 to thereby resume the processing of causing the temperature of the detection element of the gas sensor 5 to approach the activation temperature (the target temperature).

When the control section 21 makes a negative judgment in S110 or completes the processing of S150, S170, S180, or S240, the control section 21 ends the present processing (the second heater anomaly judgment processing).

As described above, like the load drive apparatus 1 of the above-described embodiment, the second load drive apparatus which executes the second heater anomaly judgment processing judges whether or not an anomalous state (the deteriorated state or the wiring anomalous state) of the heater 11 has occurred on the basis of the results of the comparison between the electrical resistance RH of the heater 11 and three thresholds (the first threshold Rth1, the second threshold Rth2, and the third threshold Rth3).

Also, in the second heater anomaly judgment processing, as in the above-described heater anomaly judgment processing, when the control section 21 judges that the particular anomalous state (the battery short anomalous state or the wire breakage anomalous state) has occurred (affirmative judgment in S130), the control section 21 judges whether the particular anomalous state is the battery short anomalous state (S220) or the wire breakage anomalous state (S230) on the basis of the results of the comparison between the particular anomaly judgment value Vth and the voltage VH between the opposite ends of the heater 11 measured in S200.

Accordingly, like the load drive apparatus 1, the second load drive apparatus can judge the deteriorated state of the heater 11 while employing a configuration which can suppress an increase in production cost and can suppress useless power consumption.

3. Other Embodiments

Although embodiments of the present invention have been described, the present invention is not limited to the above-described embodiments, and the present invention can be implemented in various forms without departing from the technical scope of the present invention.

For example, the electrical load driven and controlled by the load drive apparatus is not limited to a heater for a sensor in which a solid electrolyte body is used, and may be other electrical loads. Examples of other electrical loads include a heater for heating fluid, a heater of a glow plug, a heater for heating and removing particulates which adhere to a sensor for detecting particulates such as soot, an LED, a coil-type load, and a heater for a sensor in which a metal-oxide semiconductor is used.

The numerical values of the three thresholds (the first threshold Rth1, the second threshold Rth2, and the third threshold Rth3) and the particular anomaly judgment value Vth are not limited to the above-described numerical values, and proper values may be set in accordance with various conditions such as use, apparatus configuration, etc.

Also, the third signal S3 output from the control section 21 may be always maintained at the high level without being switched between the high level and the low level during the heater anomaly judgment processing. Even in the case where the third signal S3 is always maintained at the high level, the anomaly judgment current Ih can be supplied instantaneously by turning the current supply switch 35 on and off. Notably, in the case where the third signal S3 is always maintained at the high level, the resistances of the first resistor element R1 and the second resistor element R2 of the voltage judgment section 27 must be set to values sufficiently larger than the resistance of the heater 11 so that when the switching section 23 is in the ON state, the current supplied from the battery 7 is supplied to the heater 11, not to the voltage judgment section 27.

Further, the load drive apparatus may be configured such that when the wiring anomalous state (the GND short anomalous state, the battery short anomalous state, or the wire breakage anomalous state) of the electrical load (the heater 11) is detected in the heater anomaly judgment processing, the heater energization processing and the gas detection processing are stopped. This configuration can prevent breakage of the gas sensor 5 which would otherwise occur due to the wiring anomalous state of the heater 11.

Notably, when the deteriorated state is detected, the heater energization processing and the gas detection processing may be continued without stopping them. In this case, the accuracy of the temperature control by the heater and the accuracy of the gas detection by the gas sensor may decrease. However, there is the advantage that the temperature control and the gas detection can be continued. Also, the load drive apparatus may be configured that, when the deteriorated state or the wiring anomalous state of the electrical load is detected in the heater anomaly judgment processing, the type of the detected anomalous state is stored, in an identifiable form, in a storage device (ROM) provided in the control section 21 or an external storage device, or the type of the detected anomalous state is reported to the outside in an identifiable form.

DESCRIPTION OF REFERENCE NUMERALS

1: load drive apparatus
5: gas sensor
7: battery
11: heater
21: control section
23: switching section
25: current supply section
27: voltage judgment section
31: first switching element
33: current generation section
35: current supply switch
37: amplifier
41: second switching element
51: changeover switch section
53: AD conversion section.

What is claimed is:

1. A load drive apparatus, comprising:
an application voltage controller for applying a pulse voltage to an electrical load to drive and control the electrical load with the pulse voltage alternately assuming a high voltage and ground voltage;
a current source;
a current source controller that provides an anomaly judgment current from the current source to the electrical load when the pulse voltage assumes the ground voltage; and
an anomaly detector that receives an electrical characteristic of the electrical load when the anomaly judgment current is supplied to the electrical load, and determines whether the electrical load is in any of a plurality of anomalous states, the plurality of anomalous states including at least a deteriorated state of the electrical load and one or more wiring anomalous states of the electrical load.

2. A load drive apparatus according to claim 1, wherein
the electrical load is a heater which generates heat when energized;
the electrical characteristic of the electrical load is an electrical resistance of the electrical load;
the anomaly detector compares the electrical resistance of the electrical load to three predetermined thresholds and determines whether or not the electrical load is in any of the plurality of anomalous states on the basis of the comparison;
the three thresholds are a first threshold, a second threshold greater than the first threshold, and a third threshold greater than the second threshold;
the anomaly detector determines that the electrical load is in a short-to-ground anomalous state when the electrical resistance of the electrical load is equal to or less than the first threshold, the short-to-ground anomalous state being one of the one or more wiring anomalous states of the electrical load in which opposite ends of the electrical load are connected to the ground voltage;
the anomaly detector determines that the electrical load is in a normal state when the electrical resistance of the electrical load is greater than the first threshold and is equal to or less than the second threshold;
the anomaly detector determines that the electrical load is in the deteriorated state when the electrical resistance of the electrical load is greater than the second threshold and is equal to or less than the third threshold, the deteriorated state being one of the plurality of anomalous states in which the electrical load is deteriorated; and
the anomaly detector determines that the electrical load is in a particular anomalous state when the electrical resistance of the electrical load is greater than the third threshold, the particular anomalous state being one of the one or more wiring anomalous states of the electrical load and which includes at least one of a short-to-power anomalous state in which the opposite ends of the electrical load are connected to the high potential and a wire breakage anomalous state in which an energization path for applying the pulse voltage to the electrical load is broken.

3. A load drive apparatus according to claim 2, wherein upon determining that the electrical load is in the particular anomalous state, the anomaly detector compares a voltage between the opposite ends of the electrical load with a predetermined particular anomaly judgment value when the pulse voltage assumes the ground voltage or when the control of the pulse voltage by the application voltage control section is not performed, and the anomaly detector determines that the electrical load is in the short-to-power anomalous state when the voltage between the opposite ends of the electrical load is greater than the particular anomaly judgment value or that the electrical load is in the wire breakage anomalous state when the voltage between the opposite ends of the electrical load is equal to or less than the particular anomaly judgment value.

* * * * *